United States Patent
Otsuka et al.

(10) Patent No.: US 6,486,045 B2
(45) Date of Patent: Nov. 26, 2002

(54) APPARATUS AND METHOD FOR FORMING DEPOSITED FILM

(75) Inventors: Takashi Otsuka, Shizuoka-ken (JP); Tatsuyuki Aoike, Shizuoka-ken (JP); Toshiyasu Shirasuna, Shizuoka-ken (JP); Kazuyoshi Akiyama, Shizuoka-ken (JP); Hitoshi Murayama, Shizuoka-ken (JP); Daisuke Tazawa, Shizuoka-ken (JP); Kazuto Hosoi, Shizuoka-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/851,552

(22) Filed: May 10, 2001

(65) Prior Publication Data

US 2002/0038630 A1 Apr. 4, 2002

(30) Foreign Application Priority Data

May 15, 2000 (JP) ........................................ 2000-142163

(51) Int. Cl.$^7$ ............................ H01L 21/20; H01L 21/36
(52) U.S. Cl. ...................... 438/485; 438/764; 438/778; 118/723 R; 118/723 E
(58) Field of Search ................................ 438/764, 778, 438/485; 118/723 R, 723 E

(56) References Cited

U.S. PATENT DOCUMENTS

| | | | |
|---|---|---|---|
| 6,044,792 A | * 4/2000 | Ogawa et al. | ............ 118/723 E |
| 6,076,481 A | * 6/2000 | Yamagami et al. | ...... 118/723 E |
| 6,145,469 A | 11/2000 | Teranishi et al. | ......... 118/723 E |
| 6,155,201 A | 12/2000 | Murayama et al. | ...... 118/723 E |
| 6,312,524 B1 | * 11/2001 | Ogawa et al. | .......... 118/723 R |
| 6,397,775 B1 | * 6/2002 | Sano et al. | ................ 118/723 I |

FOREIGN PATENT DOCUMENTS

JP 9310181 A 12/1997

* cited by examiner

Primary Examiner—John F. Niebling
Assistant Examiner—Lynne A. Gurley
(74) Attorney, Agent, or Firm—Fitzpatrick, Cella, Harper & Scinto

(57) ABSTRACT

In order to make possible formation of a deposited film of a relatively large area at a treatment rate which could not accomplished by the plasma process of the prior art, and in order to make possible stable production of the deposited film without variation in film quality, in an apparatus and a method for forming a deposited film, a part of a reaction vessel is formed of a dielectric member, at least one high-frequency electrode is arranged so as to face at least one substrate with interposition of the dielectric member, an earth shield is arranged so as to cover the reaction vessel and the high-frequency electrode, plasma is generated between the high-frequency electrode and the substrate, and a deposited film is formed under the conditions in which the following equation:

$$0.8 \times (\epsilon 2/d3) < 1/(d1/\epsilon 1 + d2/\epsilon 2)$$

is satisfied where d1 is the thickness of the dielectric member, d2 is the distance from the surface of the high-frequency electrode to the dielectric member, d3 is the distance from the surface of the high-frequency electrode to the inside surface of the earth shield, $\epsilon 1$ is a dielectric constant of the dielectric member, and $\epsilon 2$ is a dielectric constant of a space between the reaction vessel and the earth shield.

8 Claims, 3 Drawing Sheets

APPARATUS AND METHOD FOR FORMING DEPOSITED FILM

BACKGROUND OF THE INVENTION

1. Field of the Invention

The present invention relates to an apparatus and method for forming functional deposited films and more particularly to an apparatus and method for forming functional deposited films which are suitably usable for preparing an amorphous silicon (hereinafter referred to as "a-Si") photosensitive member for electrophotograph by using plasma CVD.

2. Related Background Art

There have been proposed amorphous materials such as, for example, amorphous silicon compensated with hydrogen or/and halogen as a device member for use in semiconductor devices, light-receiving members for electrophotograph, line sensors for image-input use, image pickup devices, photovoltaic devices, and other semiconductor devices represented by various electronic devices.

Some of these devices, however, have room for improvement in characteristics and production cost of their production. For example, in the production of light-receiving members for electrophotograph, since deposited films of a relatively large area are required to be formed, formation of such deposited films with uniformity in both thickness and electric characteristics and with less defects becomes difficult. Thus there have been demands for a method for forming deposited films for such use which ensures satisfactory productivity and yield.

The deposited films as described above can be formed by the plasma enhanced CVD process, that is, by decomposing a raw material gas with the aid of direct current or high-frequency microwave glow discharge to deposit a thin film on a substrate consisting of a material such as glass, quartz, heat-resistant synthetic resin film, stainless steel, or aluminum. And there have been proposed various apparatus which enable the formation of deposited films which satisfy the above demands.

The apparatus for forming deposited films as described above have, for example, a configuration shown in the schematic view of FIGS. 1A and 1B schematically. FIG. 1A is a schematic transverse sectional view of an apparatus for forming deposited films and FIG. 1B is a schematic longitudinal sectional view of an apparatus for forming deposited films.

The apparatus for forming deposited films shown in FIGS. 1A and 1B includes a reaction vessel 301 having a vacuum air-tight structure. Inside the reaction vessel 301 a plurality of cylindrical substrates 302 for forming deposited films are arranged in such a state that they are mounted on and held by respective substrate holders. Each of the substrate holders for holding the cylindrical substrates 302 can be rotated with a rotating shaft 310 driven by a rotating mechanism 311 consisting of a motor and a gear. Inside the rotating shaft 310 a heater is provided for adjusting the temperature of the cylindrical substrate 302. Further, inside the reaction vessel 301 electrodes 304 for introducing high-frequency electric power and gas introducing pipes 308 for introducing a raw material gas are disposed. To the electrodes 304 a high-frequency power source 307 is connected via a matching unit 306. Each of the gas introducing pipes 308 includes a plurality of openings for emitting gas uniformly and is connected to a raw material gas cylinder via a flow rate control portion (not shown in the figure). One end of an exhaust hole 309 is open to the reaction vessel 301 and the other end communicates with an exhauster (not shown in the figure).

The formation of deposited films by using the conventional apparatus for forming deposited films as described above is performed in the following procedure.

First, the cylindrical substrates 302 each mounted on a substrate holder are installed inside the reaction vessel 301. Then, the reaction vessel 301 is exhausted with a vacuum pump (not shown in the figure) and its internal pressure is decreased to, for example, 10 Pa or less. Then, current is applied to the heater (not shown in the figure) arranged inside each substrate holder to heat each cylindrical substrate 302 to a temperature suitable for depositing films. Once the temperature of the substrates 302 reaches a desired value, a gas for forming a deposited film, such as silane gas, is introduced into the reaction vessel 301 through the gas introducing pipes 308. At the same time, the high-frequency power source 307 is set at a desired electric power to generate high-frequency energy of, for example, 105 MHZ, and high-frequency electric power is introduced into the reaction vessel 301 through the high-frequency matching unit 306, so as to allow glow discharge to occur. This discharge energy serves to decompose the raw material gas introduced into the reaction vessel 301 and form a desired deposited film on each substrate 302. During the formation of deposited films, each rotating shaft 310 is rotated by rotating the rotating mechanism 311 to rotate each substrate 302. Repeating the same operation a plurality of times allows the formation of light-receiving films having desired multilayer structure.

On the other hand, the manufacturing of a-Si photosensitive members (photosensitive members containing a hydrogen-based amorphous material at least in its photoconductive layer) requires advanced technology. Particularly in the photosensitive members for electrophotograph, they require films of larger area and thickness than those of other devices and accordingly, it is an important element how the uniformity of the films is ensured and how the film is formed at a higher deposition rate. From that viewpoint, there have been proposed various methods of manufacturing high quality a-Si photosensitive members in an industrially stable manner. For example, U.S. Pat. No. 6,145,469 (Japanese Patent Application Laid-Open No. 9-310181) discloses a technique of uniformly plasma-treating a substrate of a relatively large area while speeding up the treatment by constituting a part of a reaction vessel with a dielectric member and generating a plasma between a cathode electrode and its counter electrode which are placed interposing the dielectric vessel part therebetween to plasma-treat the substrate in the vessel.

In recent years, however, with increasing demands for electrophotographic apparatus which allow higher-quality images and speed-up, there have also been increasing demands for an apparatus for forming photosensitive members which meets the above demands and has high productivity. Thus the present inventors have concentrated their energy on investigating a method for forming high-quality deposited films at a higher deposition rate using high-frequency electric power with a frequency band of 50 to 450 MHZ. The film formation at this discharge frequency, however, gives rise to a problem such that plasma tends to be maldistributed, and thereby non-uniform treatment is likely to occur in film thickness and quality. This problem is serious particularly when treating a relatively large area, such as of a photosensitive member for electrophotograph. Furthermore, a problem arises such that plasma discharge is difficult to start and the disorder of plasma at the beginning of discharge can sometimes cause deterioration of the whole film and variation in film quality over the whole film.

SUMMARY OF THE INVENTION

An object of the present invention is to provide an apparatus and a method for forming a deposited film which allow the formation of a deposited film of a relatively large area at a treatment rate which could not be accomplished by the plasma process of the prior art and allow the stable production of the deposited film without creating variation in the quality.

Another object of the present invention is to provide an apparatus and a method for forming a deposited film, in which the deposited film is formed by providing a dielectric member between at least one high-frequency electrode and a plasma region and applying high-frequency electric power to plasma, whereby a more uniform deposited film can be formed.

Another object of the present invention is to provide an apparatus for forming a deposited film which does not cause contamination of a substrate due to the peeling of the by-products deposited on a high-frequency electrode, thereby allowing the formation of a deposited film of higher quality, which makes it easier to clean the inside of its reaction vessel and to adjust its electrodes, and which is excellent in maintainability.

Another object of the present invention is to provide an apparatus for forming a deposited film which is designed to maintain a desired ratio of the impedance from the surface of its high-frequency electrode to plasma through its dielectric member to the impedance from the surface of its high-frequency electrode to its earth shield, and thereby allows the easy and reliable start of plasma discharge.

Another object of the present invention is to provide an apparatus and a method for forming a deposited film which allow the elimination of the bad effect on an initial deposited film due to the non-smooth start of plasma discharge, and thereby allows the stable production of the deposited film of higher quality.

Another object of the present invention is to provide an apparatus and a method for forming a deposited film which allow the formation of an initial deposited film under more ideal conditions, and thereby allow the improvement in the film quality.

Another object of the present invention is to provide an apparatus and a method for forming a deposited film which allow the stable plasma discharge over a wider range of conditions, and thereby allow dealing with the formation of various types deposited films.

Still another object of the present invention is to provide an apparatus and a method for forming a deposited film which allow the prevention of the maldistribution of plasma probably due to errors in apparatus, for example, an error in setting at each film forming operation, and thereby allow the improvement in uniformity in the quality of a deposited film in the same lot.

A further object of the present invention is to provide an apparatus and a method for forming a deposited film which allow the formation of a deposited film of high and uniform quality on a large area of a substrate at a high deposition rate and allow the stable mass production of a large area of a deposited film excellent particularly in the electrophotographic characteristics.

A still further object of the present invention is to provide an apparatus for forming a deposited film, comprising: a pressure-reducible reaction vessel a part of which is formed of a dielectric member; at least one substrate and raw material gas introducing means both arranged inside the reaction vessel; at least one high-frequency electrode arranged outside the reaction vessel; and an earth shield arranged in such a manner as to cover the reaction vessel and the high-frequency electrode, wherein high-frequency electric power is applied to the high-frequency electrode, high-frequency electric power is introduced into the reaction vessel through the dielectric member constituting the part of the reaction vessel to generate glow discharge in the reaction vessel, thereby decomposing the raw material gas introduced into the reaction vessel, and wherein the following equation (1):

$$0.8\times(\epsilon 2/d3)<1/(d1/\epsilon 1+d2/\epsilon 2) \tag{1}$$

is satisfied where $d1$ is the thickness of the dielectric member, $d2$ is the distance from the surface of each of the high-frequency electrodes to the dielectric member, $d3$ is the distance from the surface of the high-frequency electrode to the inside surface of the earth shield, $\epsilon 1$ is a dielectric constant of the dielectric member, and $\epsilon 2$ is a dielectric constant of a space between the reaction vessel and the earth shield. Preferably, the substrate and the high-frequency electrode are provided in plurality, respectively.

BRIEF DESCRIPTION OF THE DRAWINGS

FIG. 1A is a schematic transverse sectional view and FIG. 1B is a schematic longitudinal sectional view;

FIG. 2A is a schematic transverse sectional view and FIG. 2B is a schematic longitudinal sectional view.

DETAILED DESCRIPTION OF THE PREFERRED EMBODIMENTS

Figure 1A:
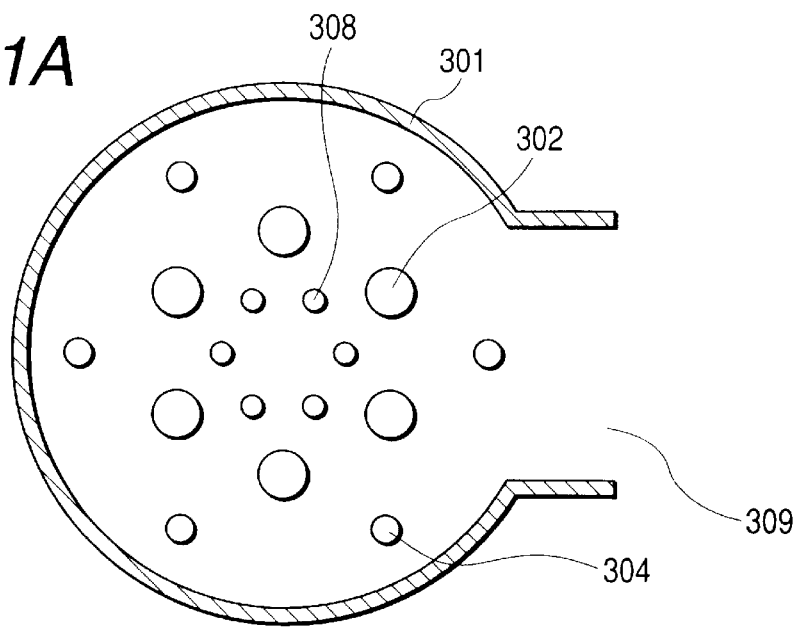
FIGS. 1A and 1B are schematic views showing one example of apparatus for forming deposited films.
Figure 1B:
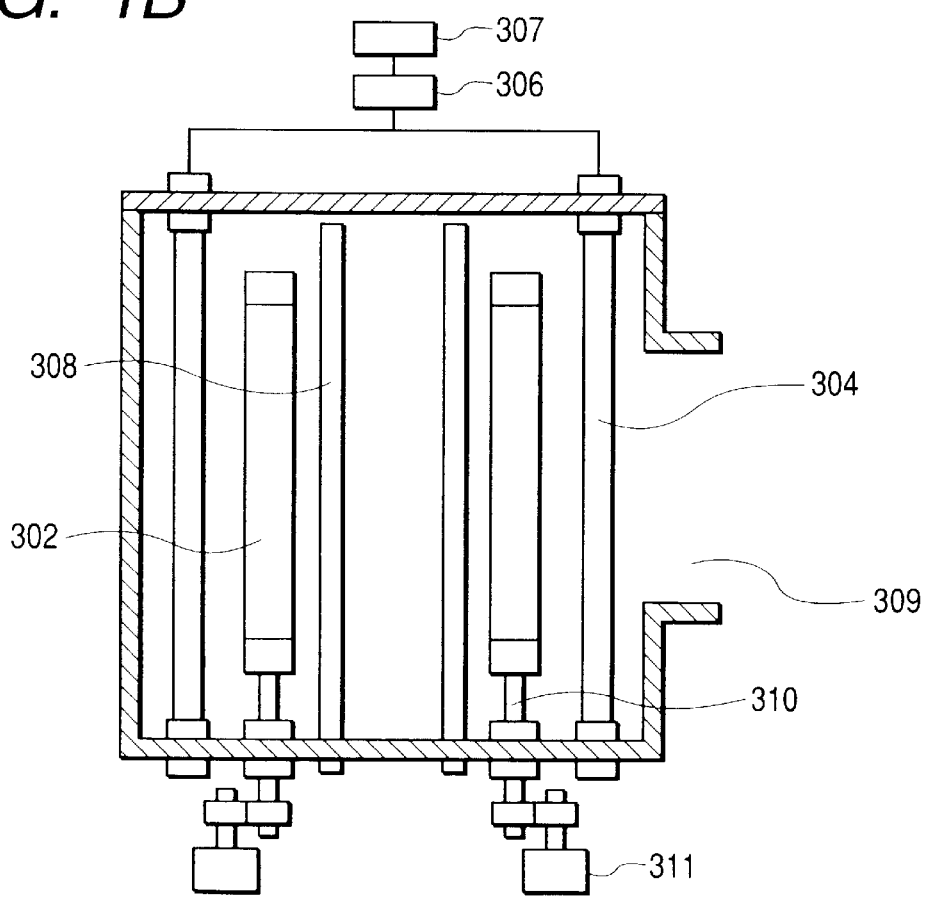

According to the present invention, a part of the reaction vessel is constituted with a dielectric member and high-frequency electric power is introduced from the high-frequency electrodes arranged outside of the reaction vessel through the dielectric member.

This construction allows the configuration inside the reaction vessel to be simple and allows the reaction vessel itself to be small, since the high-frequency electrodes are arranged outside the reaction vessel. This improves the efficiency in the use of raw material gas and provides an apparatus for forming deposited films excellent in terms of costs.

In cases where the high-frequency electrodes are arranged inside the reaction vessel, the by-products deposited on the outer surface of the high-frequency electrodes peel off and then deposit on the substrates, which makes the abnormal growth of deposited films to start and can sometimes cause an image defect. In the case of the present invention, however, since the high-frequency electrodes arranged outside of the reaction vessel, an image defect can be prevented from occurring.

Further, one of the causes of strength non-uniformity in plasma may be the effect of the standing wave on the surface of the high-frequency electrodes; however, in the case of the present invention, the electric member existing between the high-frequency electrodes and plasma functions as a cushion against the direct reflection of the standing wave of the surface of the high-frequency electrodes on plasma. As a result, the non-uniformity created in the deposited films can be reduced.

Further, arranging high-frequency electrodes outside the reaction vessel makes easier the maintenance of the apparatus, for example, cleaning the inside of the reaction vessel, which in turn makes easier the formation of deposited films requiring changes in or adjustment of the high-frequency electrodes depending on the situations.

In the plasma enhanced CVD apparatus using high-frequency electric power, generally, impedance matching is performed with a matching unit placed between the high-frequency electrodes and plasma, in order to allow an efficient transmittance of high-frequency electric power to the plasma in the reaction vessel. However, in the actual apparatus, fine-tuning in most cases is necessary at every deposition, because the conditions of the apparatus change delicately.

And in some cases, depending on the conditions inside the reaction vessel, such as pressure, kind and flow rate of a raw material gas, and frequency of high-frequency electric power, the start of plasma discharge is difficult or the adjustments for starting the discharge takes a long time. It goes without saying that it is problematic that plasma discharge does not occur, and even in cases where plasma discharge does not start smoothly, its effects on the deposited films can sometimes be serious. If there exists disorder in plasma discharge at the beginning, non-uniformity in the quality of the initial deposited film formed at that time affects the entire photosensitive member to be formed. Particularly in the multilayer photosensitive members, the disorder occurring at the boundary between adjacent layers at the beginning of plasma discharge causes damage to the lower layer, which can sometimes result in deterioration in the film quality. Further, the initial deposited film largely affects the adhesive characteristics of the deposited film to a substrate, therefore, layer peeling off can sometimes easily occur.

In the formation of deposited films, the temperature of the substrates is one of the important parameters in determining the characteristics of deposited films, and the apparatus for forming deposited films usually include a mechanism for regulating the temperature in some way. In the cases where discharge is difficult to start, when the loss of time required to regulate the substrate temperature so as to start discharge exceeds the capability of the mechanism for regulating the substrate temperature, the substrate temperature at the beginning of deposition cannot be ideal temperature and can sometimes generate variation in the film quality. As described above, the problem of being unable to start discharge smoothly can sometimes come to the surface in the form of variation in the film quality of each lot. Particularly when forming multilayered photosensitive members, discharge can sometimes be more difficult to start at the beginning of discharge for forming second and third layers, since the surface of the substrates and the inside of the apparatus at that time have already been coated with deposited films and the electric characteristics of their surface have been changed. Furthermore, when discharge is difficult to start, there may arise another problem of unstable discharge even while discharge is proceeding.

In light of the above problems, there have been proposed methods for making plasma discharge easier by changing deposition conditions only at the beginning of discharge. In such methods, for example, excess high-frequency power source compared with the ideal one is introduced into the discharge space, pressure is increased, or the flow rate of a raw material gas is increased at the beginning of discharge.

However, with the methods in which deposition conditions are changed only at the beginning of discharge, the initial deposited films formed under the conditions which are not optimal can sometimes affect the quality of the entire photosensitive films to be formed; thus, the use of such methods is not preferable. Further, in cases where the amount of high-frequency power is increased temporarily, there arises a problem that a spark is likely to be produced in the discharge region. In addition, even if discharge occurs once, there arise afterward a problem of the decay of discharge due to the mismatching of impedance caused when adjusting the deposition conditions to the ideal ones. And there still arises a problem of requiring more complicated apparatus and processes in order to keep up with the conditions.

According to the present invention, the relationship among the dielectric member constituting a part of the reaction vessel, the high-frequency electrodes and the earth shield is satisfied in the range shown by the following equation (1):

$$0.8 \times (\epsilon 2/d3) < 1/(d1/\epsilon 1 + d2/\epsilon 2) \tag{1}$$

(where d1: the thickness of the dielectric member, d2: the distance from the surface of each of the high-frequency electrodes to the dielectric member, d3: the distance from the surface of each of the high-frequency electrodes to the inside surface of the earth shield, $\epsilon 1$: dielectric constant of the dielectric member, and $\epsilon 2$: dielectric constant of a space between the reaction vessel and the earth shield), thereby allowing easier start of discharge. The reason why this allows easier start of discharge may be that the impedance from the high-frequency electrodes to plasma through the dielectric member of the reaction vessel can be kept small compared with the impedance from the high-frequency electrodes to the earth shield. And such easy start of discharge allows matching high-frequency electric power under wider conditions, which in turn allows keeping up with the film formation on wider variety of prescriptions.

Even in such an apparatus for forming deposited films, there sometimes arises non-uniformity of density distribution of plasma. This may cause non-uniformity in the film quality, and in cases where a plurality of substrates are treated in the same reaction vessel, variation in the film quality may be generated in every substrates. The reason why variation in the film quality is generated is not clear yet, but may be considered as follows. In the case of the holding members for holding the substrates, for example, repeating deposition and cleaning generates a delicate difference in distortion among them. And repeating attachment and detachment of the substrate also generates a difference in fixing conditions among them. Such delicate differences among the members requiring setting at each film forming operation may generate a spot inside the reaction vessel at which discharge is concentrated locally, thereby resulting in the maldistribution of plasma. And the more the number of the constituent members is increased and the apparatus becomes complicated, the more the difference in setting is likely to be generated. Thus, this maldistribution of plasma becomes a serious problem particularly when treating a plurality of substrates at a time in order to improve productivity. In the case of the high-frequency electrodes, increasing their number generates a delicate difference among each high-frequency transmission path between the matching circuit and the high-frequency electrodes, which is likely to cause the high-frequency electric power applied to the electrodes to be out of balance.

There may be some cases where the maldistribution of plasma discharge occurs even while the discharge is proceeding. This may be attributed to the changes in the conditions, under which the plasma discharge is proceeding, caused by the effect of thermal expansion due to the change in furnace temperature and the effect of the films deposited inside the furnace.

In light of the above problems, the present inventors conducted a further investigation and finally have found that the frequency of the occurrence of maldistribution of plasma and the magnitude of plasma can be decreased when satisfying the following equation (2):

$$1/(d1/\epsilon1+d2/\epsilon2)<5\times(\epsilon2/d3) \quad (2)$$

and arranging the earth shield closer to the high-frequency electrodes to some extent.

One of the reasons for the above may be that increasing the effect of the earth shield on the high-frequency electrodes is effective in making it difficult to concentrate the discharge at the portion which is the cause of plasma maldistribution. Another reason may be that since the earth shield is allowed to have ground potential without failure and hardly undergoes changes in setting at each film forming operation and in the conditions during film formation, the effects of the members, in which an error is likely to arise at each film forming operation, are absorbed by the earth shield, thereby leading to the stabilization of the conditions of the entire apparatus.

The oscillating frequency of the high-frequency electric power applied to the above high-frequency electrodes is suitably in the range of 50 to 450 MHz.

In the following, the embodiments of the present invention will be described with reference to the accompanying drawings.

Figure 2A:
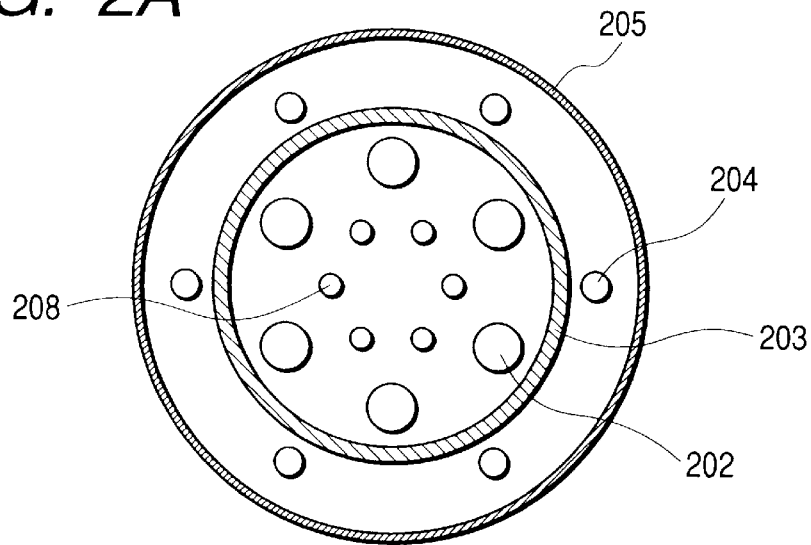
FIGS. 2A and 2B are schematic views showing one embodiment of the apparatus for forming deposited films in accordance with the present invention.
Figure 2B:
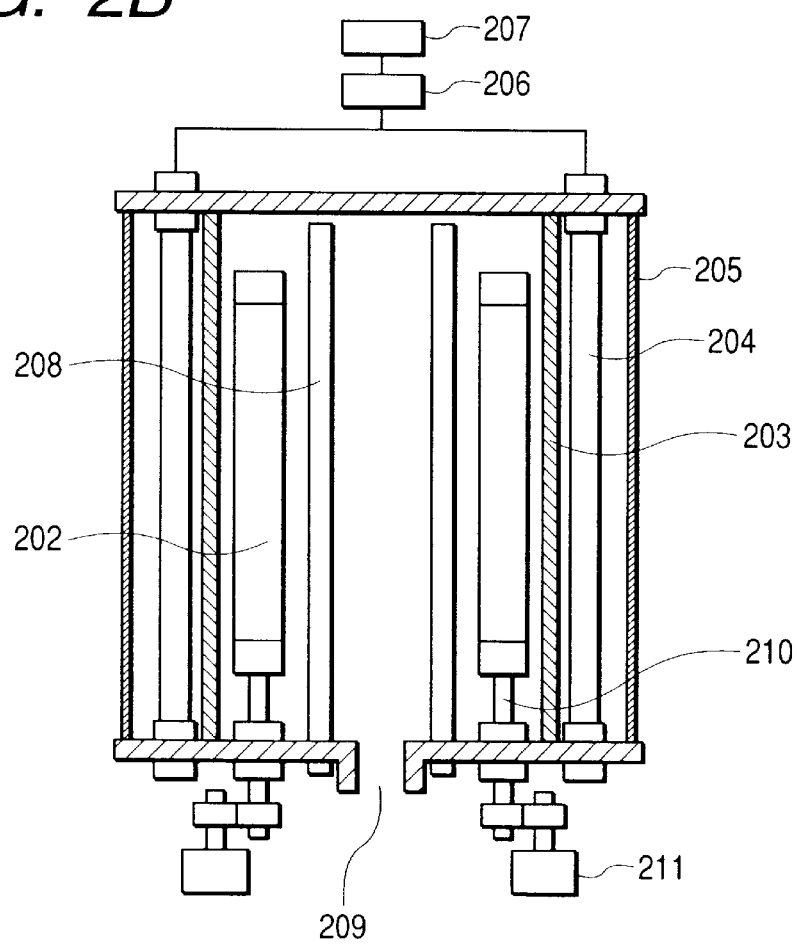

One embodiment of the apparatus for forming deposited films in accordance with the present invention has, for example, a configuration shown by the schematic views of FIGS. 2A and 2B. FIG. 2A is a schematic transverse sectional view showing one embodiment of the apparatus for forming deposited films in accordance with the present invention, FIG. 2B is a schematic longitudinal sectional view of the same apparatus.

The apparatus for forming deposited films shown in FIGS. 2A and 2B includes a reaction vessel having vacuum air-tight structure, and a part (the side portion) of the reaction vessel consists of a cylindrical dielectric member 203. Inside the reaction vessel a plurality of cylindrical substrates 202 are arranged in state where they are mounted on and held by respective substrate holder. Each of the substrate holders for holding the cylindrical substrates 202 can be rotated with a rotating shaft 210 driven by a rotating mechanism 211 consisting of a motor and a gear. Inside the rotating shaft 210 a heater is provided for adjusting the temperature of the cylindrical substrate 202. Further, inside the reaction vessel gas introducing pipes 208 for introducing a raw material gas etc. are disposed. Each of the gas introducing pipes 208 has a plurality of openings for uniformly emitting the gas and is connected to a raw material gas cylinder via a flow rate control portion (not shown in the figure).

Outside the reaction vessel, high-frequency electrodes 204 are arranged for introducing high-frequency electric power through the dielectric member 203 which constitutes a part of the reaction vessel. To the high-frequency electrodes 204 a high-frequency power source 207 is connected via a matching unit 206. Outside the high-frequency electrodes 204, an earth shield 205 is provided in such a manner as to cover the high-frequency electrodes 204 and the dielectric member 203 constituting a part of the reaction vessel, to thereby prevent the high-frequency electric power from leaking out in surroundings. One end of an exhaust hole 209 is open to the reaction vessel 301 a part of which consists of the dielectric member 203, and the other end communicates with an exhauster (not shown in the figure).

The formation of deposited films by using the apparatus for forming deposited films in accordance with this embodiment is performed in the following procedure.

First, the cylindrical substrates 202 each mounted on a substrate holder are installed inside the reaction vessel 201. Then, the reaction vessel 201 is exhausted with a vacuum pump (not shown in the figure) and its internal pressure is decreased to, for example, 10 Pa or less. Subsequently, current is applied to the heater (not shown in the figure) arranged inside each substrate holder to heat each cylindrical substrate 202 to a temperature suitable for depositing films and keep the temperature. Once the temperature of the substrates 202 reaches a desired value, a gas for forming a deposited film, such as silane gas, is introduced into the reaction vessel through the gas introducing pipes 208. At the same time, the high-frequency power source 207 is set at a desired electric power to produce high-frequency energy of, for example, 105 MHz, and high-frequency electric power is introduced into the reaction vessel 201 from the high-frequency power source 207 through the high-frequency matching unit 206 to generate glow discharge. This discharge energy serves to decompose the raw material gas introduced into the reaction vessel 201 and form a desired deposited film on each substrate 202. During the formation of deposited films, each rotating shaft 210 is rotated by the rotating mechanism 211 to rotate each substrate 202. Repeating the same operation a plurality of times allows the formation of light-receiving films having a desired multi-layer structure.

Figure 3:
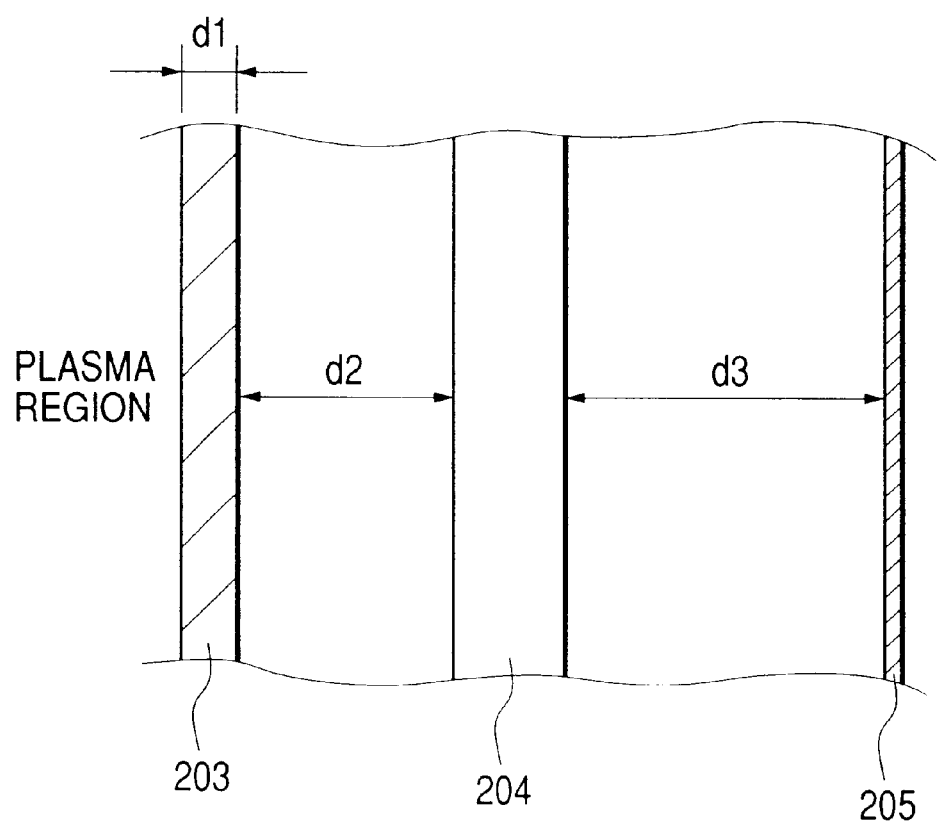
FIG. 3 is a partly schematic fragmentary sectional view showing the arrangement of a high-frequency electrode, a dielectric member and an earth shield in the apparatus shown in FIGS. 2A and 2B.

FIG. 3 is a fragmentary sectional view of the apparatus shown in FIGS. 2A and 2B. Now the relationship among the dielectric member 203 constituting a part of the reaction vessel, the high-frequency electrodes 204 and the earth shield 205 will be described with reference to FIG. 3. In the apparatus of this embodiment, it is required that the following equation (1):

$$0.8\times(\epsilon2/d3)<1/(d1/\epsilon1+d2/\epsilon2) \quad (1)$$

is satisfied where d1 is the thickness of the dielectric member 203, d2 is the distance from the surface of each of the high-frequency electrodes 204 to the dielectric member 203, d3 is the distance from the surface of each of the high-frequency electrodes 204 to the inside surface of the earth shield 205, $\epsilon1$ is a dielectric cnstant of the dielectric member 203, and $\epsilon2$ is a dielectric constant of the space surrounding the high-frequency electrodes 204 (i.e., the space between the dielectric member (a part of the reaction vessel) 203 and the earth shield 205).

Preferably, the following equation (2):

$$1/(d1/\epsilon 1 + d2/\epsilon 2) < 5 \times (\epsilon 2/d3) \tag{2}$$

is further satisfied.

This limits the ratio of the impedance from the surface of the high-frequency electrodes to the plasma region through the dielectric member to the impedance from surface of the high-frequency electrodes to the surface of the earth shield.

The embodiment shown in FIG. 3 is the case where cylindrical dielectric member and earth shield, and columnar electrodes are used, however, in cases where the apparatus consists of components of more complicated shape, each set value has only to be determined by drawing a straight line which allows the left and right hand sides of the equation to become the maximum.

The shape of the substrates used in the present invention is not limited to any specific one. Although cylindrical substrates are generally used, the present invention is effective when using a plurality of substrates having a cylindrical shape in conbination and even when using substrates which do not take the form of cylinders. The number of the cylindrical substrates used is not limited, either. A single or a plurality of cylindrical substrates may be used; however, from the standpoint of improvement in production efficiency, it is preferable that many substrates are treated at a time. The configuration of a plurality of substrates is not particularly limited, however, preferably the substrates are arranged in such a manner that the glow discharge region is formed within the region surrounded by the substrate.

As the materials for the substrates, conductive materials or materials having a surface treated to be conductive are usually used. The conductive materials used include, for example, metals such as Al, Cr, Mo, Au, In, Nb, Ni, Te, V, Ti, Pt, Pb and Fe and the alloys thereof. The materials having the surface treated to be conductive include, for example, alumina ceramics, aluminium nitride, boron nitride, silicon nitride, silicon carbide, silicon oxide, beryllium oxide, quart glass, pyrex glass, in addition, synthetic resins such as polycarbonate, polyamide, polyimide and Teflon which have a surface treated to be conductive.

Preferably the substrates are provided with a mechanism for regulating the substrate temperature, such as a heater.

The shape of the reaction vessel is not particularly limited, however, at least a part of the reaction vessel within the range into which electric power can be introduced from the high-frequency electrodes consists of a dielectric member. The materials for the dielectric member are not particularly limited, however, those having a small loss of high frequency are preferably used. Those materials include, for example, ceramics consisting of alumina, titanium dioxide, aluminium nitride, boron nitride, zircon, cordierite, zircon-cordierite, silicon oxide, or beryllium oxide mica, as a material. The dielectric member is required to be strong enough to withstand atmospheric pressure, since it constitutes a part of the wall of the pressure-reducible reaction vessel.

As the materials for the high-frequency electrodes, any materials can be used as long as they are conductive. Those materials include, for example, metals such as Al, Cr, Cu, Mo, Au, Ag, In, Nb, Ni, Te, V, Ti, Pt, Pb and Fe and the alloys thereof such as stainless steel, Inconel and Hastelloy. They may be the combination of a plurality of components. The high-frequency electrodes may have any shapes; however, from the standpoint of processability, bar-shaped electrodes having a circular section can be used. Preferably many high-frequency electrodes are used because the use of many high-frequency electrodes can sometimes make the state of plasma more uniform. And one or more power sources may be connected to these high-frequency electrodes.

The earth shield for preventing the high-frequency electric power from leaking is set at a ground potential and arranged in such a manner as to be electrically insulated from the high-frequency electrodes. As the materials for the earth shield, any materials can be used as long as they are conductive. Those materials include, for example, metals such as Al, Cr, Cu and Fe and the alloys thereof such as stainless steel. The earth shield may have any shape.

According to the present invention, a raw material gas is decomposed by the application of high-frequency electric power to the high-frequency electrodes. Preferably the frequency of the high-frequency electric power applied in the present invention is in the range of 50 to 450 MHz.

According to the experiments made by the present inventors, when the frequency of the high-frequency electric power applied is as low as less than 50 MHz, the high-frequency electric power is difficult to supply efficiently to plasma, since the complex impedance due to the dielectric member is inversely proportion to the frequency. Thus the deposition rate is greatly lowered, in addition, stable plasma discharge becomes difficult to ensure.

When the frequency of the high-frequency electric power applied is higher than 450 MHz, the wavelength of the high frequency becomes small, and thereby the effects of the inductance and capacitance of the apparatus itself as a high-frequency transmission circuit become large. This makes it difficult to ensure stable plasma discharge.

The high frequency may have any waveforms, however, those shaped into sine waves, rectangular waves, etc. are suitably used.

The magnitude of the high-frequency electric power is properly determined depending on the characteristics of the targeted deposited films; however, preferably it is in the range of 10 to 5000 W per substrate, and more preferably in the range of 20 to 2000 W per substrate.

With respect to the raw material gases used in the present invention, for example when forming amorphous silicon films, gaseous or gasifiable silicon hydrides (silanes) such as $SiH_4$ and $Si_2H_6$ are effectively used as Si supplying gases. In addition, gaseous or gas substances including silicon compounds containing fluorine atoms, known as the fluorine-substituted silane derivatives, such as silicon fluorides, for example $SiF_4$ and $Si_2F_6$, and fluorine-substituted silicon hydrides such as $SiH_3F$, $SiH_2F_2$ and $SiHF_3$ are also effectively used as the Si supplying gases of the present invention. The Si supplying raw material gases may be diluted with gases such as $H_2$, He, Ar, and Ne as the need arises, and such diluted raw material gases may be still effectively used in the present invention.

In addition to the above-described gases, the atoms belonging to the III group of the periodic table (for example, boron, gallium, indium) or the atoms belonging to the V group of the periodic table (for example, phosphorus, arsenic) can be used as a dopant.

The optimal range of the gas pressure inside the reaction vessel is properly selected depending on the characteristics of a targeted deposited films. Normally, the gas pressure is preferably in the range of 0.01 to 1000 Pa, more preferably 0.03 to 300 Pa, and optimally 0.1 to 100 Pa.

The arrangement of the substrates and the high-frequency electrodes and the shape of the reaction vessel and the earth shield are not particularly limited; however, each substrate is preferably under the same conditions. As a method for allowing each substrate to be under the same conditions, for example, the respective configurations of the substrates and high-frequency electrodes may be made similar to each other, and the shapes of the reaction vessel and the earth shield may be made similar to each other. For example, when using a cylindrical reaction vessel, preferably the substrates and the high-frequency electrodes are arranged in respective circles concentric with the reaction vessel, at the same time, a cylindrical earth shield is selectively used. Arranging the substrates and the high-frequency electrodes in respective circles allows each substrate to be under almost the same conditions.

When using a rectangular reaction vessel, preferably the substrates and the high-frequency electrodes are arranged in respective rectangles, at the same time, a rectangular earth shield is selectively used. Such arrangement has the advantage that an apparatus for forming deposited films can consist of a combination of plate-shaped members, and is effective in reducing the cost of the apparatus itself.

In the following the examples of the present invention will be described; however, it should be understood that these examples are shown for illustrative purposes only and are not intended to limit the present invention.

EXAMPLE 1

Photosensitive members each consisting of a conductive substrate, a charge injection blocking layer, a photoconductive layer and a surface layer were formed using the apparatus for forming deposited films shown in FIGS. 2A and 2B under the conditions shown in Table 1, wherein an aluminium cylinder of 80 mm in diameter and 358 mm in length was used as the substrate and an alumina ceramics having dielectric constant of 10 was used as the dielectric member of the reaction vessel into which high-frequency electric power is introduced.

TABLE 1

|  | Charge Injection Blocking Layer | Photoconductive Layer | Surface Layer |
|---|---|---|---|
| Flow Rate of Raw Material Gas | | | |
| SiH$_4$ [mL/min (normal)] | 200 | 200 | 25 |
| H$_2$ [mL/min (normal)] | 200 | 400 | |
| B$_2$H$_6$ [PPM] (relative to SiH$_4$) | 3000 | 1.3 | |
| NO [mL/min (normal)] | 10 | | |
| CH$_4$ [mL/min (normal)] | | | 100 |
| Internal Pressure [Pa] | 1.3 | 1.3 | 1.3 |
| Total Power [W] | 1500 | 2000 | 500 |
| Substrate Temperature [° C.] | 260 | 260 | 260 |
| Targeted Film Thickness [μm] | 3 | 25 | 0.5 |

Formation of photosensitive member was performed ten times under the same conditions while changing the distance from the high-frequency electrodes to the earth shield by changing the diameter of the earth shield each time. The easiness of activating the discharge and the variation in the charging performance were evaluated as follows:

Easiness of Activating Discharge:

The evaluation was made based on the regulating time required to start stable discharge. When the discharge started within one minute of regulating time, the evaluation result was shown by ○. When the regulation sometimes took more than one minute, the evaluation result was shown by Δ. And when the discharge sometimes did not start even after 5 or more minutes of regulating time, the evaluation result was shown by x.

Variation in Charging Performance:

Each of the produced photosensitive members was set in an electrophotographic apparatus (NP6750 manufactured by Canon and modified for test use), electric current of 800 μA was applied to a charger, corona discharge was allowed to occur, and the dark surface potential of the photosensitive member for electrophotograph was measured with a surface electrometer.

For all of the produced photosensitive members, standard deviations of the charging performance measured as described above were calculated, and the variation in the charging performance was evaluated as a relative evaluation when setting the value of G (comparative example) to 100.

Table 2 shows the distances from the high-frequency electrodes to the earth shield, the ratios of the impedance from the high-frequency electrodes to plasma to the impedance from the high-frequency electrodes to the earth shield, the evaluation results of easiness of activating discharge, and variation in the charging performance.

TABLE 2

|  | Distance d3 from High-frequency Electrode to Earth Shield (mm) | Impedance Ratio I$_1$/I$_2$ | Easiness of Activating Discharge | Variation in Charging Performance |
|---|---|---|---|---|
| A (Present Example) | 300 | 5.88 | ○ | 87 |
| B (Present Example) | 250 | 4.90 | ○ | 75 |
| C (Present Example) | 200 | 3.92 | ○ | 71 |
| D (Present Example) | 150 | 2.94 | ○ | 69 |
| E (Present Example) | 60 | 1.18 | ○ | 62 |
| F (Present Example) | 50 | 0.98 | ○ | 64 |
| G (Comparative Example) | 40 | 0.78 | Δ | 100 |
| H (Comparative Example) | 30 | 0.59 | X | — |

In the impedance ratio $I_1/I_2$ shown in Table 2, $I_1$ is shown by "$1/(d1/\epsilon1+d2/\epsilon2)$", and $I_2$ is shown by "$\epsilon2/d3$", where d1 is the thickness of the dielectric member, d2 is the distance from the surface of each of the high-frequency electrodes to the dielectric member of the reaction vessel, d3 is the distance from the surface of each of the high-frequency electrodes to the inside surface of the earth shield, $\epsilon1$ is a dielectric constant of the dielectric member which constitutes the reaction vessel, and $\epsilon2$ is a dielectric constant between the reaction vessel and the earth shield.

It is apparent from the results shown in Table 2 that when the relationship equation of the present invention is satisfied, plasma discharge is easy to start, and deposited films can be formed with a stable and good yield.

EXAMPLE 2

Experiment was made in the same manner as in Example 1 by using the apparatus shown in FIGS. 2A and 2B. In this experiment, however, no change was made in the earth shield, and the thickness of the dielectric member itself and the distance from the dielectric member to the high-frequency electrodes were changed by using dielectric members, which are cylindrical alumina ceramics having the same inside diameter but different outside diameter.

Then evaluation was made in the same manner as in Example 1. The variation in the charging performance was obtained as a relative evaluation when setting the value of C (comparative example) to 100. The results are shown in Table 3.

TABLE 3

| | Thickness d1 of Dielectric Member Constituting Part of Reaction Vessel (mm) | Impedance Ratio $I_1/I_2$ | Easiness of Activating Discharge | Variation in Charging Performance |
|---|---|---|---|---|
| A (Present Example) | 20 | 1.95 | ○ | 65 |
| B (Present Example) | 15 | 0.86 | ○ | 71 |
| C (Comparative Example) | 10 | 0.78 | △ | 100 |
| D (Comparative Example) | 5 | 0.72 | X | — |

It is apparent from the results shown in Table 3 that when the relationship equation of the present invention is satisfied, plasma discharge is easy to start and stable deposited films can be formed.

EXAMPLE 3

Experiment was made in the same manner as in Example 1 by using the apparatus shown in FIGS. 2A and 2B. In this experiment, however, a cylindrical member having a dielectric constant of 8.5 and a thickness of 15 mm, which was formed of ceramics comprising aluminium nitride as the material, was used as the dielectric member constituting a part of the reaction vessel. And easiness of activating the discharge was evaluated while changing the distance from the high-frequency electrodes to the earth shield by changing the diameter of the earth shield, similarly as in Example 1. The results are shown in Table 4.

TABLE 4

| | Distance d3 from High-frequency Electrode to Earth Shield (mm) | Impedance Ratio $I_1/I_2$ | Easiness of Activating Discharge |
|---|---|---|---|
| A (Present Example) | 60 | 1.28 | ○ |
| B (Present Example) | 50 | 1.07 | ○ |
| C (Present Example) | 40 | 0.86 | ○ |
| D (Comparative Example) | 30 | 0.64 | X |

It is also apparent from the results shown in Table 4 that when the relationship equation of the present invention is satisfied, plasma discharge is easy to start.

As described so far, in the apparatus for forming deposited films according to the present invention, high-frequency electric power is supplied to plasma in the reaction vessel provided therein with the dielectric member between the high-frequency electrodes and a plasma region, and thereby more uniform deposited films can be formed. And the high-frequency electrodes are arranged outside the reaction vessel, which allows the prevention of the substrate from being contaminated with the by-products deposited on and peeling off from the high-frequency electrodes and thereby deposited films of higher quality can be formed. Furthermore, the apparatus of the present invention makes it easier to clean the inside of the reaction vessel and adjust the electrodes, whereby the apparatus of the present invention can be excellent in maintainability.

At the same time, in the apparatus for forming deposited films according to the present invention, the ratio of the impedance from the surface of the high-frequency electrodes to plasma through the dielectric member to the impedance from the surface of the high-frequency electrodes to the earth shield is kept at a desired value, and thereby easier and more reliable start of discharge can be ensured. This in turn allows the elimination of the adverse effect on an initial deposited film due to the non-smooth start of plasma discharge, and thereby the production of deposited films of higher quality can be performed more stably. Further, the formation of an initial deposited film can be performed under more ideal conditions, which allows the improvement in the film quality. Still further, the stable plasma discharge can be performed over a wider range of conditions, which allows dealing with the formation of various types deposited films. And the maldistribution of plasma probably due to errors in an apparatus, for example, an error in setting at each film forming operation can be prevented, and thereby the uniformity in the quality of deposited films in the same lot can be improved.

Thus, according to the present invention, deposited films of high and uniform quality can be formed on a substrate having a large area at a high deposition rate. Deposited films having a large area and being excellent particularly in the electrophotographic characteristics can be stably produced.

What is claimed is:

1. An apparatus for forming a deposited film comprising:
   a pressure-reducible reaction vessel a part of which is formed of a dielectric member;
   at least one substrate and a raw material gas introducing means both arranged inside said reaction vessel;
   at least one high-frequency electrode arranged outside said reaction vessel; and
   an earth shield arranged so as to cover said reaction vessel and said high-frequency electrode,
   wherein a high-frequency electric power is applied to said high-frequency electrode;
   a high-frequency electric power is introduced into said reaction vessel through said dielectric member constituting the part of said reaction vessel;
   generating glow discharge in said reaction vessel; and
   thereby decomposing the raw material gas introduced into said reaction vessel to form a deposited film on said substrate, and
   wherein a following equation:

$$0.8 \times (\epsilon_2/d_3) < 1/(d_1/\epsilon_1 + d_2/\epsilon_2)$$

is satisfied where d1 is a thickness of said dielectric member, d2 is a distance from a surface of said high-frequency electrode to said dielectric member, d3 is a distance from the surface of said high-frequency electrode to the inside surface of said earth shield, $\epsilon_1$ is a dielectric constant of said dielectric member, and $\epsilon_2$ is a dielectric constant of a space between said reaction vessel and said earth shield.

2. The apparatus according to claim 1, wherein a following equation:

$$1/(d_1/\epsilon_1 + d_2/\epsilon_2) < 5 \times (\epsilon_2/d_3)$$

is further satisfied.

3. The apparatus according to claim 1, wherein the oscillating frequency of the high-frequency electric power applied to said high-frequency electrode is in a range of 50 to 450 MHz.

4. The apparatus according to claim 1, wherein said substrate and said high-frequency electrode are provided in plurality, respectively.

5. A method for forming a deposited film on a substrate, comprising the steps of:

arranging at least one substrate and a raw material gas introducing means inside a pressure-reducible reaction vessel a part of which is formed of a dielectric member;

arranging at least one high-frequency electrode outside said reaction vessel;

arranging an earth shield so as to cover said reaction vessel and said high-frequency electrode;

applying a high-frequency electric power to said high-frequency electrode;

introducing the high-frequency electric power into said reaction vessel through said dielectric member constituting the part of said reaction vessel;

generating glow discharge in said reaction vessel; and thereby decomposing the raw material gas introduced into said reaction vessel to form a deposited film on the substrate, wherein the following equation:

$$0.8 \times (\epsilon 2/d3) < 1/(d1/\epsilon 1 + d2/\epsilon 2)$$

is satisfied where d1 is a thickness of said dielectric member, d2 is the distance from a surface of said high-frequency electrode to said dielectric member, d3 is a distance from the surface of said high-frequency electrode to the inside surface of said earth shield, $\epsilon 1$ is a dielectric constant of said dielectric member, and $\epsilon 2$ is a dielectric constant of a space between said reaction vessel and said earth shield.

6. The method according to claim 5, wherein said deposited film is formed in a state where the following equation:

$$1/(d1/\epsilon 1 + d2/\epsilon 2) < 5 \times (\epsilon 2/d3)$$

is further satisfied.

7. The method according to claim 5, wherein said oscillating frequency of the high-frequency electric power applied to said high-frequency electrode is in a range of 50 to 450 MHZ.

8. The method according to claim 5, wherein said substrate and said high-frequency electrode are provided in plurality, respectively.

* * * * *